United States Patent
Yang et al.

(10) Patent No.: US 10,874,036 B2
(45) Date of Patent: Dec. 22, 2020

(54) CABINET AND ELECTRONIC DEVICE

(71) Applicant: Delta Electronics, Inc., Taoyuan (TW)

(72) Inventors: Shan-Chun Yang, Taoyuan (TW); Chia-Hsing Chen, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 0 days.

(21) Appl. No.: 16/382,668

(22) Filed: Apr. 12, 2019

(65) Prior Publication Data
US 2020/0113082 A1 Apr. 9, 2020

(30) Foreign Application Priority Data
Oct. 8, 2018 (TW) .............................. 107213587 U

(51) Int. Cl.
*H05K 7/20* (2006.01)
*H05K 5/02* (2006.01)

(52) U.S. Cl.
CPC .......... *H05K 7/209* (2013.01); *H05K 5/0213* (2013.01); *H05K 5/0217* (2013.01); *H05K 7/20409* (2013.01); *H05K 7/20909* (2013.01)

(58) Field of Classification Search
CPC .... H05K 7/209; H05K 5/0213; H05K 5/0217; H05K 7/20409; H05K 7/20909
See application file for complete search history.

(56) References Cited

U.S. PATENT DOCUMENTS

| | | | | |
|---|---|---|---|---|
| 4,726,193 A * | 2/1988 | Burke | ..................... | F25B 21/02 62/354 |
| 5,909,358 A * | 6/1999 | Bradt | .................. | H01L 23/4093 257/726 |
| 7,338,186 B1 * | 3/2008 | Wu | ......................... | F21S 2/005 362/240 |
| 7,475,801 B2 * | 1/2009 | Johansen | ............ | B29C 66/3022 228/1.1 |
| 8,687,357 B2 * | 4/2014 | Nagano | ................... | H02M 7/08 165/104.33 |
| 10,349,562 B2 * | 7/2019 | Kondo | ................. | H05K 5/0017 |
| 2005/0168951 A1 * | 8/2005 | Hirafuji | ............. | H05K 7/20336 361/700 |
| 2008/0259569 A1 * | 10/2008 | Lin | ........................ | G06F 1/203 361/704 |
| 2008/0302120 A1 * | 12/2008 | Kang | .................... | F24F 1/0014 62/259.1 |
| 2009/0139245 A1 * | 6/2009 | Blackway | ............... | F25B 21/02 62/3.62 |
| 2011/0051071 A1 * | 3/2011 | Nakamichi | .......... | G06F 1/1601 349/161 |
| 2011/0240327 A1 * | 10/2011 | Hasegawa | ................ | H05K 5/06 174/50.54 |
| 2015/0348694 A1 * | 12/2015 | Sakuma | ................ | H02M 7/003 336/60 |
| 2016/0143193 A1 * | 5/2016 | Ono | ........................ | H05K 7/20 361/692 |

(Continued)

*Primary Examiner* — Binh B Tran
*Assistant Examiner* — Michael A Matey
(74) *Attorney, Agent, or Firm* — Muncy, Geissler, Olds & Lowe, P.C.

(57) ABSTRACT

A cabinet is provided, including a case and a fin element. The case has at least one opening. The fin element is disposed in the case and is adjacent to the at least one opening and includes a main body and a plurality of fins, wherein the fins are disposed on the main body and face the at least one opening.

10 Claims, 11 Drawing Sheets

(56) References Cited

U.S. PATENT DOCUMENTS

| | | | |
|---|---|---|---|
| 2016/0178290 A1* | 6/2016 | Lim | F28F 9/001 |
| | | | 165/121 |
| 2016/0198589 A1* | 7/2016 | Kang | G02F 1/133385 |
| | | | 361/692 |
| 2016/0302326 A1* | 10/2016 | Chen | H05K 7/20554 |
| 2018/0259204 A1* | 9/2018 | Jeon | F24F 5/0042 |
| 2018/0320954 A1* | 11/2018 | Wu | F25D 23/062 |
| 2019/0237951 A1* | 8/2019 | Franck | H02G 3/086 |

* cited by examiner

CABINET AND ELECTRONIC DEVICE

CROSS-REFERENCE TO RELATED APPLICATIONS

The present application claims priority to Taiwan Patent Application No. 107213587 filed on Oct. 8, 2018, the entirety of which is incorporated by reference herein.

BACKGROUND OF THE INVENTION

Field of the Invention

The invention relates to a cabinet and an electronic device, and more particularly to a cabinet and an electronic device having a passive heat dissipation function.

Description of the Related Art

A cabinet is required for protecting communication devices that are installed outdoors from being damaged by environmental factors such as sunlight, heat radiation, rain, air, etc., to extend the lifetime of the device and keep the device operating normally.

However, some electrical energy may be transformed to heat energy during the operation of the communication devices, so the temperature of the communication devices installed in the cabinet will increase. If no means of heat dissipation is provided, the lifespan of the communication device will be shorter. Furthermore, current communication devices are mainly installed outdoors for a better communication function, so the temperature in the cabinet will be increased during a hot summer. In order to prevent high temperatures from affecting the communication function of the devices in the cabinet, active heat dissipation elements, such as a fan, a heat exchanger, an air conditioner, or a thermoelectric air conditioner, may be disposed in the current cabinets to aid in heat dissipation. However, additional energy is required when the active heat dissipation elements are disposed in the cabinet, and the cost will be increased as well. As a result, a cheap, reliable, high-efficiency heat dissipation solution is an issue with which the industry is currently concerned.

BRIEF SUMMARY OF THE INVENTION

Some embodiments of the present invention are related to a cabinet, including a case and a fin element. The fin element is disposed in the case and includes a main body and a plurality of fins disposed on the main body. The case has at least one opening on a face that corresponds to the fin element.

Some embodiments of the present invention further include a sealing assembly disposed in the case, wherein the sealing assembly, the case, and the fin elements form a space. The sealing assembly includes a frame and a waterproof pad, wherein the waterproof pad is disposed between the frame and the fin element. The fins of the fin element include a plurality of first fins disposed on one side of the main body and a plurality of second fins disposed on the other side of the main body, opposite to the side with the first fins. The first fins are longer than the second fins. The amount of the first fins is less than the amount of the second fins in a given area. The first fins face the at least one of the opening of the case.

In some embodiments of the present invention, the case of the cabinet includes a door, side plates, a top plate and a bottom plate. The top plate is opposite from the bottom plate. The door and a plurality of side plates the side plates are disposed between the top plate and the bottom plate. The fin element faces one of the side plates. The bottom plate includes a first hole corresponding to the extending direction of the fin of the fin element. The bottom plate further includes a second hole, and the cabinet further includes a pipe and a waterproof element. The pipe passes through the second hole, and the waterproof element is disposed between the pipe and the second hole to seal the gap between the pipe and the second hole.

Another embodiment of the present invention is related to an electronic device that includes a cabinet, a power converter and a fan. The power converter and the fan are disposed in the cabinet, and the fan is disposed on the power converter.

BRIEF DESCRIPTION OF THE DRAWINGS

The present invention is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION OF THE INVENTION

Figure 1:
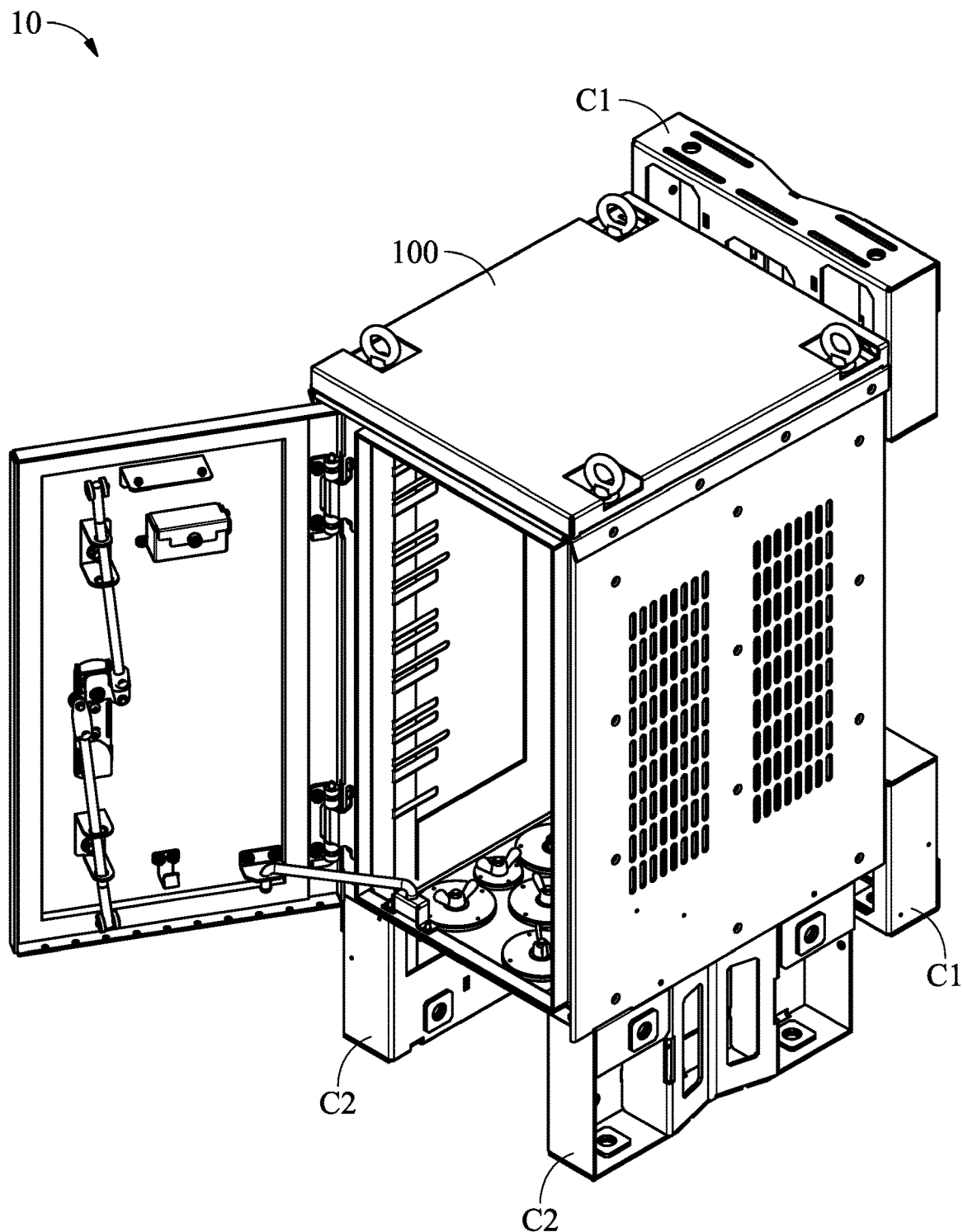
FIG. 1 is a schematic view of a cabinet of an embodiment of the present invention.

The following invention provides many different embodiments, or examples, for implementing different features of the invention. Specific examples of components and arrangements are described below to simplify the present invention. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present invention may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present invention that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present invention of one features relationship to another feature. The spatially relative terms are intended to cover different orientations of the device including the features.

Referring to FIG. 1, a schematic view of a cabinet 10 of an embodiment of the present invention is illustrated. The cabinet 10 may include a case 100, connecting elements C1 and connecting elements C2. The case 100 is used for protecting the devices (not shown) disposed in the cabinet 10 from being damaged by environmental factors, such as sunlight, heat radiation, rain and air when the cabinet 10 is installed outdoor. The connecting element C1 and the connecting element C2 may be separately disposed on two sides of the case 100 to connect and to fix the cabinet 10 with external environment (e.g. the cabinet 10 may be fixed to a utility pole or other places through the connecting elements C1 or C2). Although two connecting elements C1 and the two connecting elements C2 are shown in FIG. 1, the present invention is not limited thereto. For example, depending on design requirement, any amount of connecting elements C1 or C2 may be disposed on the case 100, to meet a user's requirements. Furthermore, the relative positions of the connecting elements C1 and C2 to the cabinet 10 may be altered based on different requirements, and is not limited to the embodiments disclosed in the present invention.

Figure 2A:
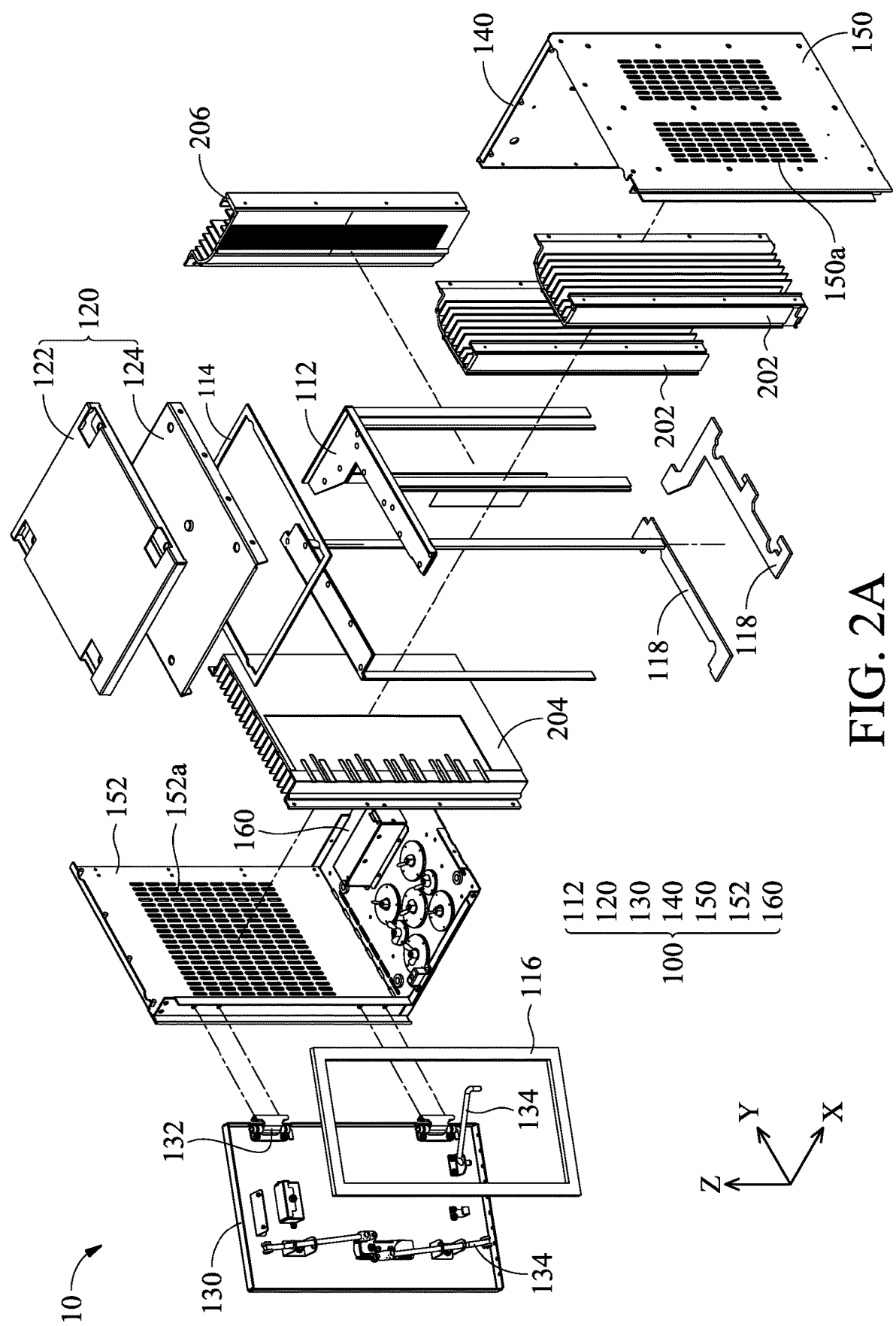
FIG. 2A is an exploded view of some elements in FIG. 1.
Figure 2B:
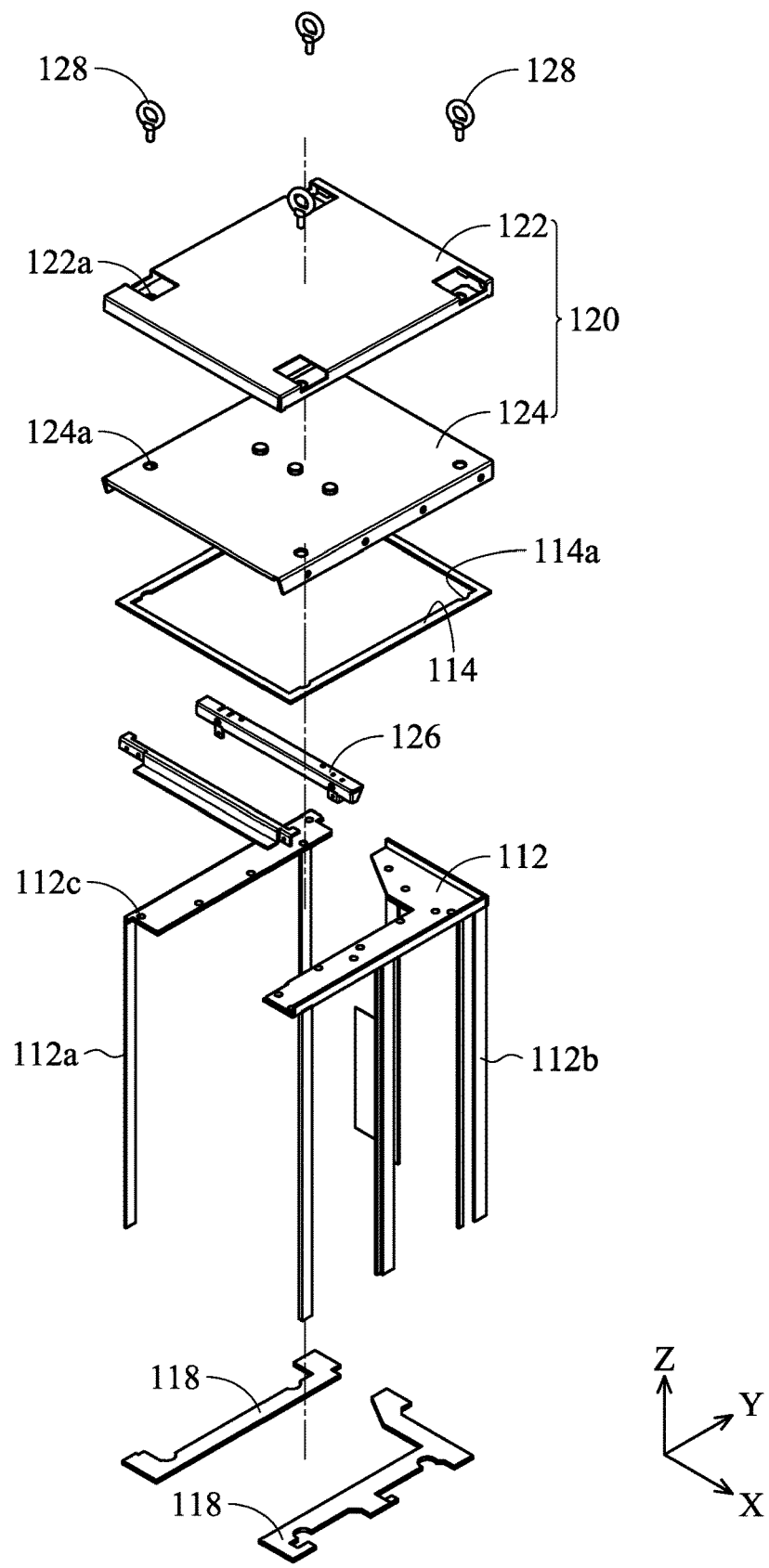
FIG. 2B is an exploded view of some elements in FIG. 1.

FIG. 2A is an exploded view of some elements of the cabinet 10 of FIG. 1. Some elements of the cabinet 10 are omitted for clarity (which are shown in FIG. 2B) in FIG. 2A. In FIG. 2A, the cabinet 10 includes a case 100, and the case 100 includes a frame 112, a top plate 120 (which includes an outer stamping element 122 and an inner stamping element 124), a door 130, a back plate 140, a side plate 150, a side plate 152 and a bottom plate 160. Furthermore, the cabinet 10 further includes fin elements 202, 204 and 206 disposed in the case 100.

In FIG. 2A, the side plate 150 and the side plate 152 are disposed on two opposite sides of the frame 112, and include at least one opening 150a and at least one opening 152a, respectively, to allow airflow. The door 130 and the back plate 140 are disposed on two opposite sides of the frame 112. The door 130 is articulated with the side plate 152 by articulation elements 132 disposed between the door 130 and the side plate 152, and the door 130 may be opened or closed relative to other elements of the cabinet 10 through an actuating element 134. A waterproof pad 116 is disposed on the door 130 to allow the door 130 to be sealed with other portion of the cabinet 10 when the door 130 is closed, to prevent rain or dust outside the cabinet 10 from entering the cabinet 10. For example, the cabinet 10 may meet several waterproofing and dust-proofing standards (e.g. IP65 waterproofing and dust-proofing standard) by providing the waterproof pad 116 in the cabinet 10. As a result, the devices disposed in the cabinet 10 may be prevented from being affected by environmental change outside the cabinet 10.

Although in FIG. 2A, the back plate 140 and the side plate 150 are illustrated as one piece, and the side plate 152 and the bottom plate 160 are illustrated as one piece, the present invention is not limited thereto. For example, the back plate 140, the side plate 150, the side plate 152 and the bottom plate 160 may be separated, or the side plate 150, the back plate 140 and the side plate 152 may be integrally formed as one piece, as long as the target of the present invention can be achieved.

The fin elements 202, 204 and 206 are formed by a protrusion process (e.g. aluminum protrusion process) and disposed between the frame 112 and the side plate 150, between the frame 112 and the side plate 152, and between the frame 112 and the back plate 140, respectively. The fin elements 202, 204 and 206 may be fixed on the frame 112 by suitable connection means, such as gluing, locking, etc. The fin elements 202, 204 and 206 has a high specific surface area, therefore the heat exchanging rate of the cabinet 10 to the air outside may be increased. For example, the fin elements 202, 204 and 206 are corresponding to an opening 150a on the side plate 150, an opening 152a on the side plate 152 and an opening 140a on the back plate 140 (shown in FIG. 4), respectively, for performing heat exchange with the air outside.

Referring to FIG. 2B, an exploded view of the frame 112 of the cabinet 10 (which includes a frame 112a and a frame 112b) and elements disposed on the frame 112, including a top plate 120 (which includes an outer stamping element 122 and an inner stamping element 124), secure elements 126, a locking element 128 and waterproof pads 114 and 118 is illustrated.

In FIG. 2B, the frame 112a and the frame 112b are fixed by the secure elements 126 and other suitable fixing means (e.g. screw, engaging element, gluing, etc.). Although the secure elements 126, the frame 112a and the frame 112b are illustrated separately, the present invention is not limited thereto. For example, the frame 112a, the frame 112b and the secure elements 126 may be integrally formed as one piece. Furthermore, it is also feasible to provide only one secure element 126 between the frame 112a and the frame 112b, and another secure element 126 may be fixed on the inner stamping element 124 by suitable fixing means. Moreover, the secure elements 126 may be fixed on the side plate 150 and the side plate 152 shown in FIG. 2A to fix the relative position between the side plate 150 and the side plate 152, depending on design requirements.

Furthermore, the frame 112 and the top plate 120 (including the outer stamping element 122 and the inner stamping element 124) are fixed by a plurality of locking elements 128. In particular, the frame 122 has connecting holes 112c, and the locking element 128 passes through a connecting hole 122a of the outer stamping element 122, a connecting hole 124a of the inner stamping element 124 and the connecting hole 112c of the frame 112 in sequence to fix these elements. The locking elements 128 may be any suitable fixing means, such as screw and nut and engaging element, etc.

The waterproof pad 114 is disposed between the frame 112 and the top plate 120, and includes recesses 114a corresponding to the positions of the locking elements 128 to prevent interference from occurring when the abovementioned elements are fixed by the locking elements 128. The waterproof pad 118 is disposed between the frame 112 and the bottom plate 160 (FIG. 2A). The waterproof pads 114 and 118 are used with the waterproof pad 116 in FIG. 2A together to prevent rain or dust outside the cabinet 10 from entering the cabinet 10 to protect the devices disposed in the cabinet 10. For example, by providing waterproof pads 114, 116 and 118 in the cabinet 10, the cabinet 10 may meet the IP65 waterproofing and dust-proofing standard.

Figure 3A:
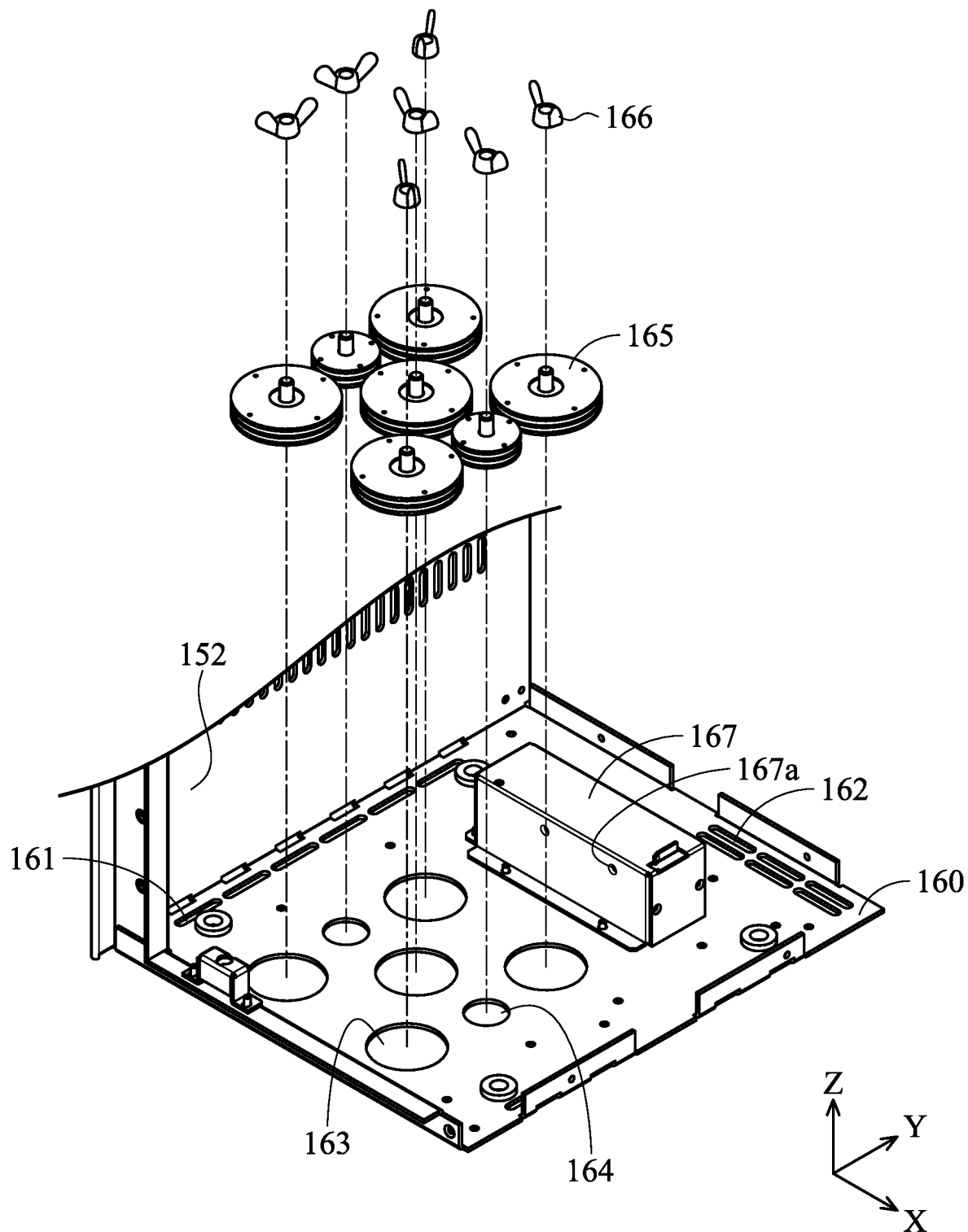
FIG. 3A is a schematic view of a bottom plate of an embodiment of the present invention.
Figure 3B:
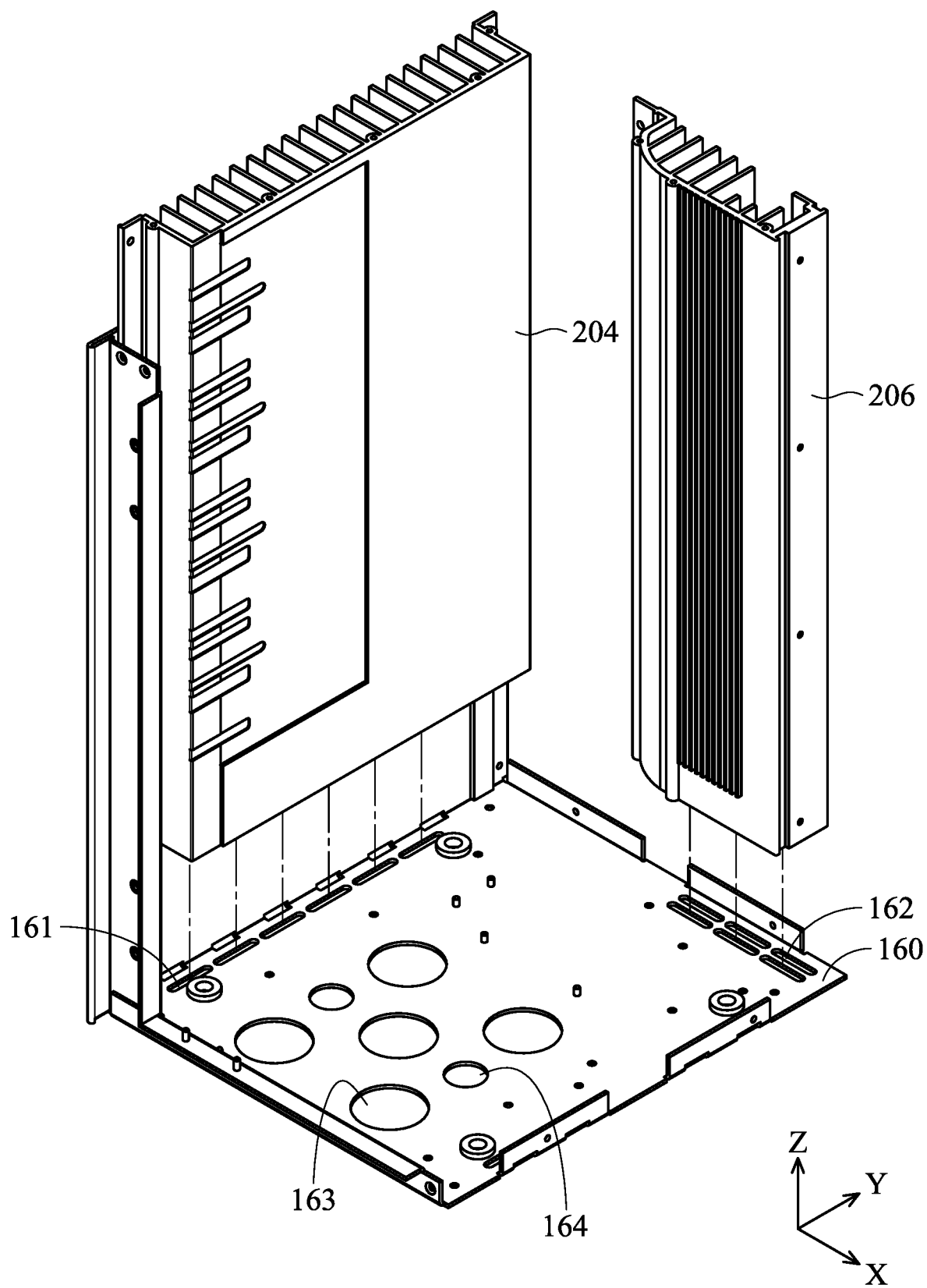
FIG. 3B is a schematic view of a bottom plate and fin elements of an embodiment of the present invention.

FIG. 3A is a schematic view of the bottom plate 160. There are a plurality of first holes 161 and 162 (drainage holes) and a plurality of second holes 163 and 164 (connecting holes) on the bottom plate 160. FIG. 3B shows the relationship of the relative positions between the bottom plate 160 and the fin elements 204 and 206, wherein the fin elements 204 and 206 move in the +Z direction relative to the bottom plate 160 to allow the first holes 161 and 162 to be seen. In FIG. 3B, the first hole 161 is formed corresponding to the fin element 204, and the first hole 162 is formed corresponding to the fin element 206. In particular, the first holes 161 and 162 correspond to the fin elements 204 and 206 and are aligned with the fin elements 204 and 206 along a direction that is perpendicular to the bottom plate 160 (Z direction), respectively, as shown by the dashed line in FIG. 3B. Rain will enter the case 100 through the opening 152a (FIG. 2A) or 140a (FIG. 4) of the case 100 when raining. At this time, the rain may be blocked by the fin elements 204 and 206 to flow toward the bottom plate 160 through the fins of the fin elements 204 and 206. As a result, by providing first holes 161 and 162 corresponding to the fin elements 204 and 206 on the bottom plate 160, water may flow down from the fin elements 204 and 206 at a faster rate to further enhance the waterproof function of the cabinet 10.

Figure 3C:
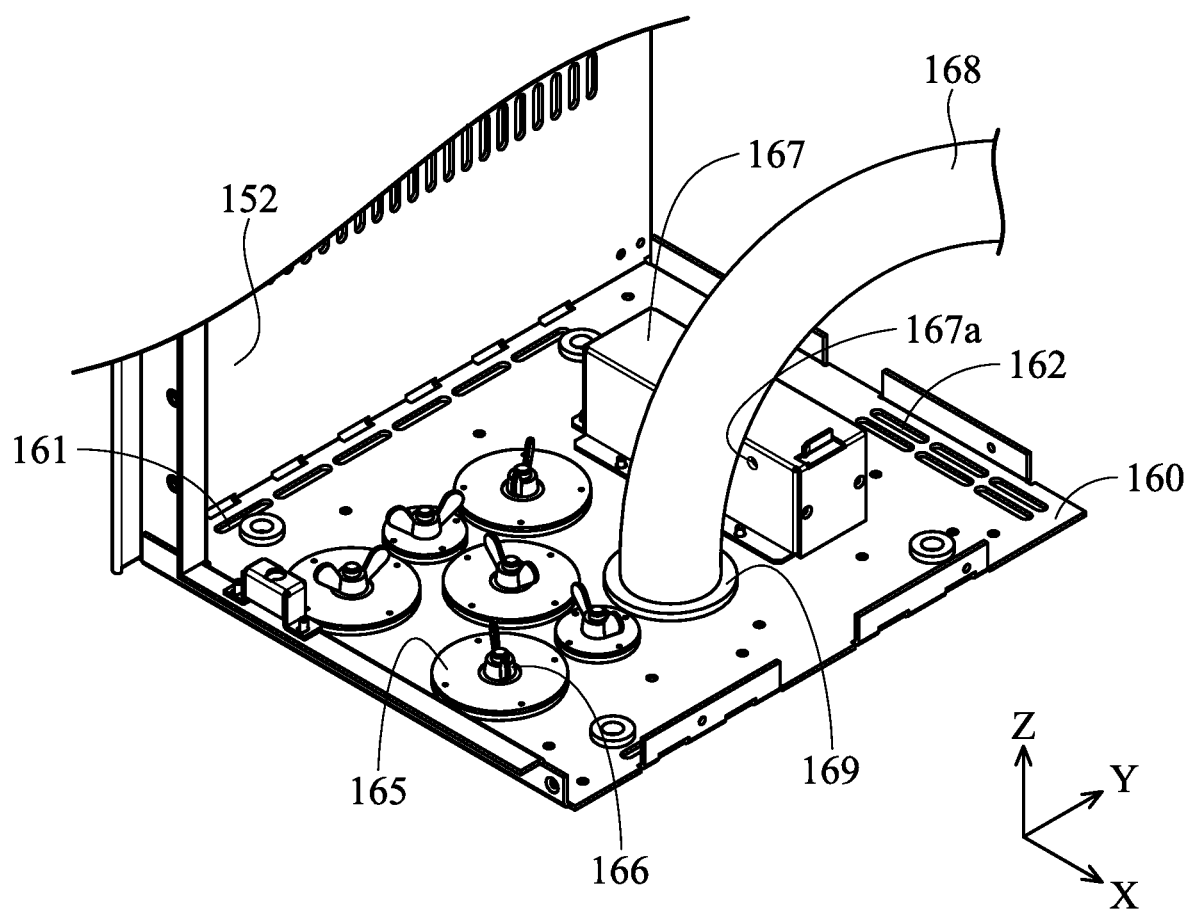
FIG. 3C is a schematic view of a bottom plate of an embodiment of the present invention.

Pipes for connecting the devices in the cabinet 10 (not shown) with other devices outside the cabinet 10 may be provided in the second holes 163 and 164. For example, as shown in FIG. 3C, pipes 168 may be provided in the second holes 163 and 164 to connect the devices in the cabinet 10 and the devices outside the cabinet 10. Waterproof elements 169 may be provided between the second holes 163 and 164 and the pipes 168 to seal the gap possibly formed between the pipes 168 and the second holes 163 and 164, to prevent water or dust outside the cabinet 10 from entering. The waterproof elements 169 may be such suitable waterproof elements as clay, cable gland, pads, etc., and the waterproof elements 169 may be disposed around the whole circumference of the pipes 168.

In FIG. 3A, the diameter of the second hole 163 is illustrated as being greater than the diameter of the second hole 164 to allow pipes having different diameters to pass through, so the flexibility of design may be increased. However, the present invention is not limited thereto. For example, the second holes 163 and 164 may have the same diameter, depending on design requirements. Furthermore, if no pipe is disposed in the second holes 163 or 164, sealing elements 165 may be disposed in the second holes 163 or 164 to prevent dust or water outside the cabinet 10 from entering the cabinet 10 through the second holes 163 or 164, as shown in FIG. 3C. Furthermore, locks 166 may be disposed on the sealing elements 165 to further fix the sealing element 165 with the bottom plate 160. Moreover, a stand 167 may be disposed on the bottom plate 160 to fix the devices disposed in the cabinet 10 thereon. For example, a power module (not shown) may be fixed on the stand 167 through holes 167a by suitable fixing means, such as securing, engaging, etc.

Figure 4:
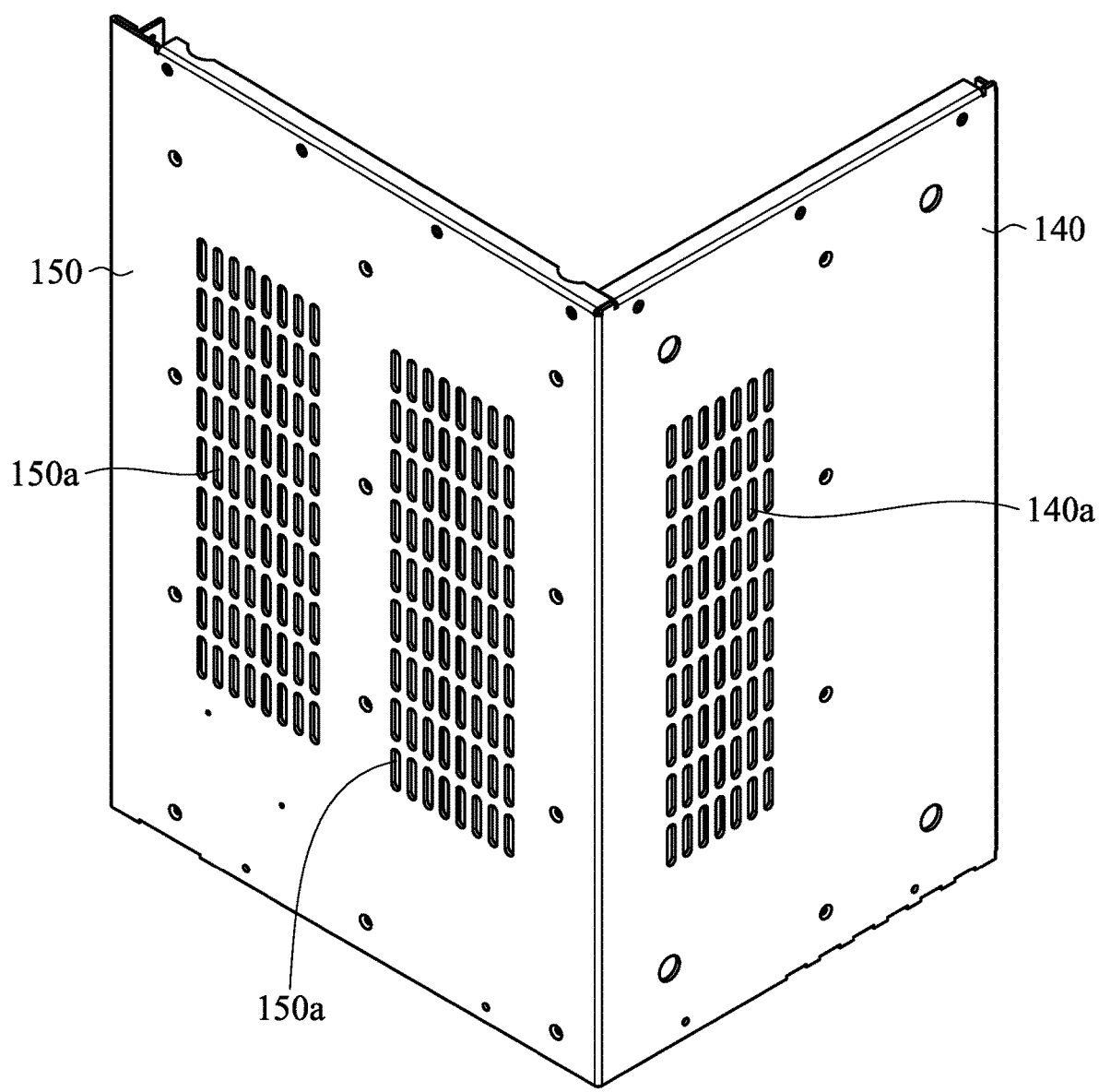
FIG. 4 is a schematic view of a back plate and a side plate of an embodiment of the present invention.

Referring to FIGS. 2A and 4, FIG. 4 is a schematic view of the back plate 140 and a side plate 150 of an embodiment of the present invention. As previously mentioned, at least one opening 140a is formed on the back plate 140, at least one opening 150a is formed on the side plate 150, at least one opening 152a is formed on the side plate 152 (FIG. 2A), and the openings 140a, 150a and 152a are corresponding to the positions of the fin elements 202, 206 and 204, respectively. For example, as shown in FIG. 2A, one fin element 202 and two fin elements 206 are provided in an embodiment of the present invention, so two groups of openings 150a and one group of openings 140a are illustrated in FIG. 4. Furthermore, the fin element 204 is greater than the fin elements 202 and 206 in FIG. 2A, so the area occupied by the openings 152a is greater than the area occupied by the openings 140a or 150a. However, the present invention is not limited thereto. Any numbers of openings may be provided with respect to the number of fin elements, depending on design requirements.

Figure 5A:
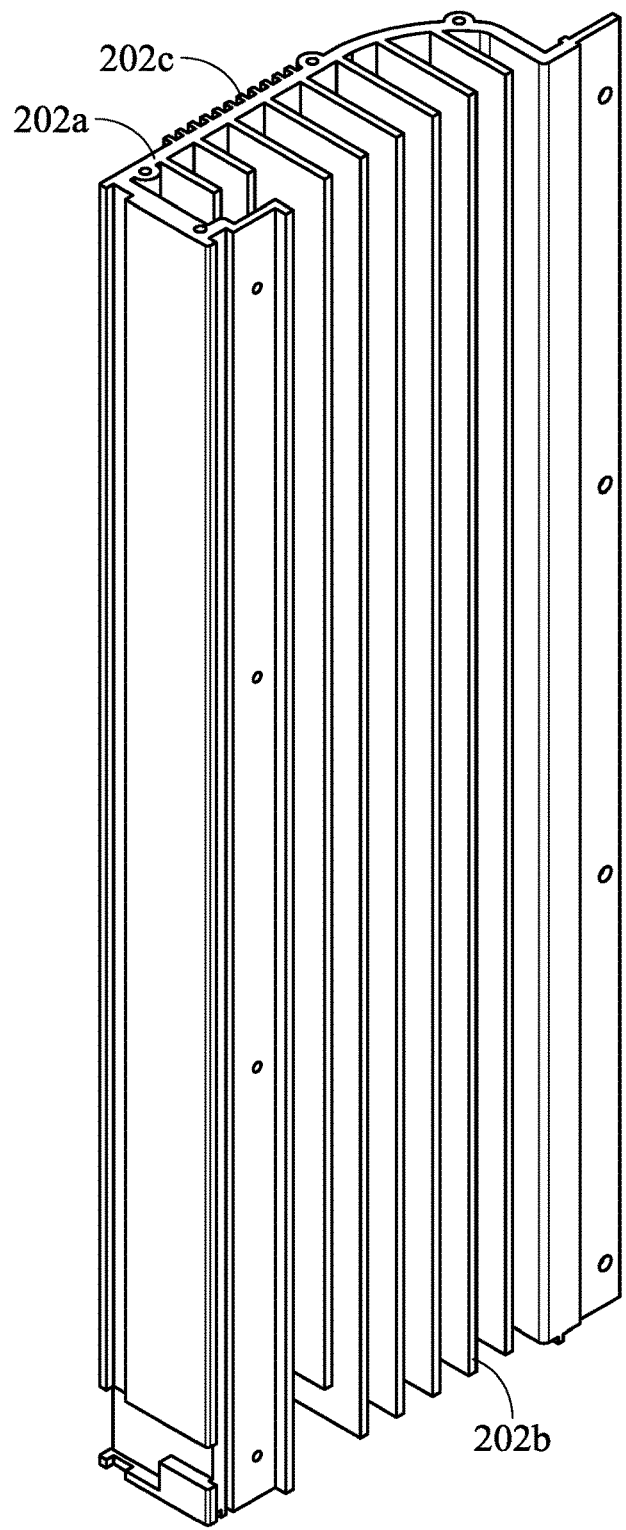
FIG. 5A is a perspective view of a fin element of an embodiment of the present invention.
Figure 5B:
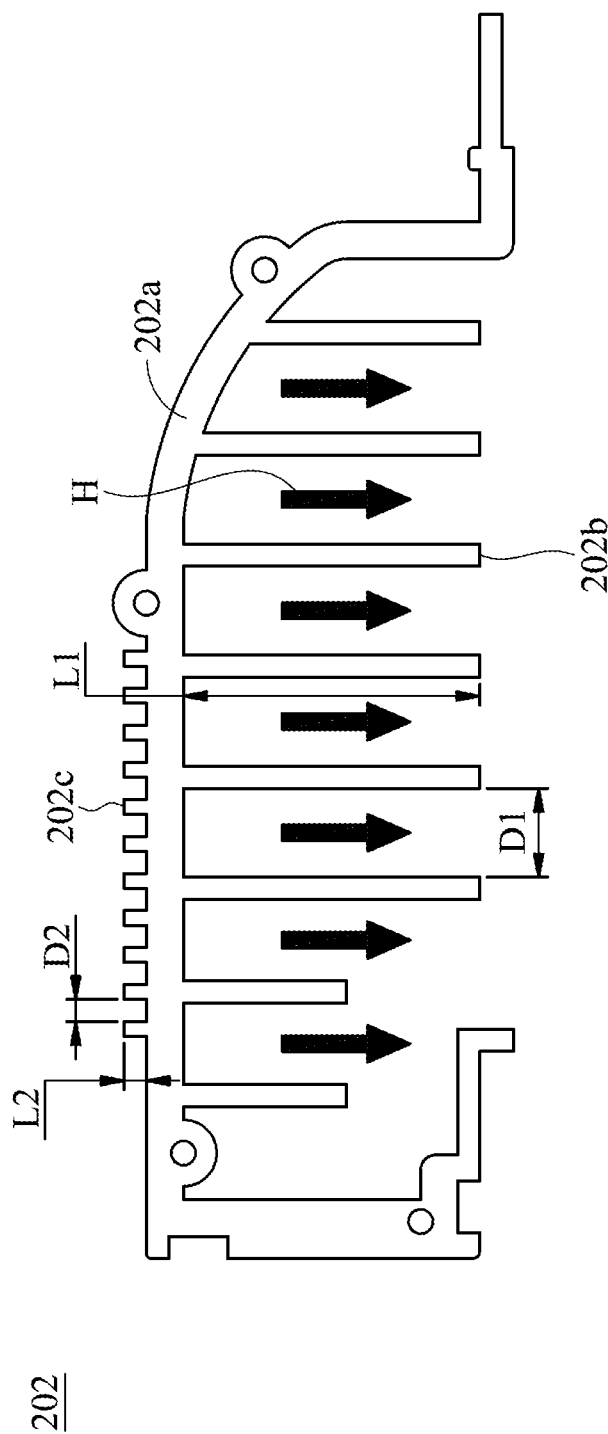
FIG. 5B is a top view of the fin element in FIG. 5A.

FIGS. 5A and 5B are a perspective view and a top view of a fin element 202 of an embodiment of the present invention, respectively. The fin element 202 includes a main body 202a and a plurality of fins disposed on the main body 202a (e.g. first fins 202b and second fins 202c). In this embodiment, the first fins 202b are disposed on one side of the main body 202a, and the second fins 202c are disposed on the other side of the main body 202a, which is the side that is opposite from the side with the first fins 202b. The first fins 202b face the openings 150a of the side plate 150 (as shown in FIG. 2A) to perform heat convection with the air outside the cabinet 10. The second fins 202c face the inside of the cabinet 10 to perform heat convection with the air in the cabinet 10.

Heat may be generated when the devices in the cabinet 10 are operating, and the heat may be transferred to the second fins 202c from air by heat convection, and then transferred to the second fins 202c. Consequently, the heat may be transferred from the second fins 202c to the main body 202a, and then from the main body 202a to the first fins 202b by heat conduction. Finally, the heat may be dissipated to the external environment by heat convection between the first fins 202b and the air outside (the heat transfer direction is indicated by the arrow H in FIG. 5B). By providing the first fins 202b and the second fins 202c on the fin element 202, the specific surface area of the fin element 202 may be increased, and the area for performing heat convection with the air is enlarged, so the efficiency of heat convection may be enhanced.

It should be noted that the dimensions of the gap between two first fins 202b is D1, the dimensions of the gap between two second fins 202c is D2, and D1>D2. In other words, in the fin element 202, there are fewer first fins 202b than second fins 202c in a given surface area. Furthermore, the length of the first fins 202b is L1, the length of the second fins is L2, and L1>L2. Moreover, not all of the first fins 202b have corresponding second fins 202c on the opposite side of the first fins 202b. The heat dissipation efficiency of the fin element 202 may be further enhanced in this manner.

Figure 6:
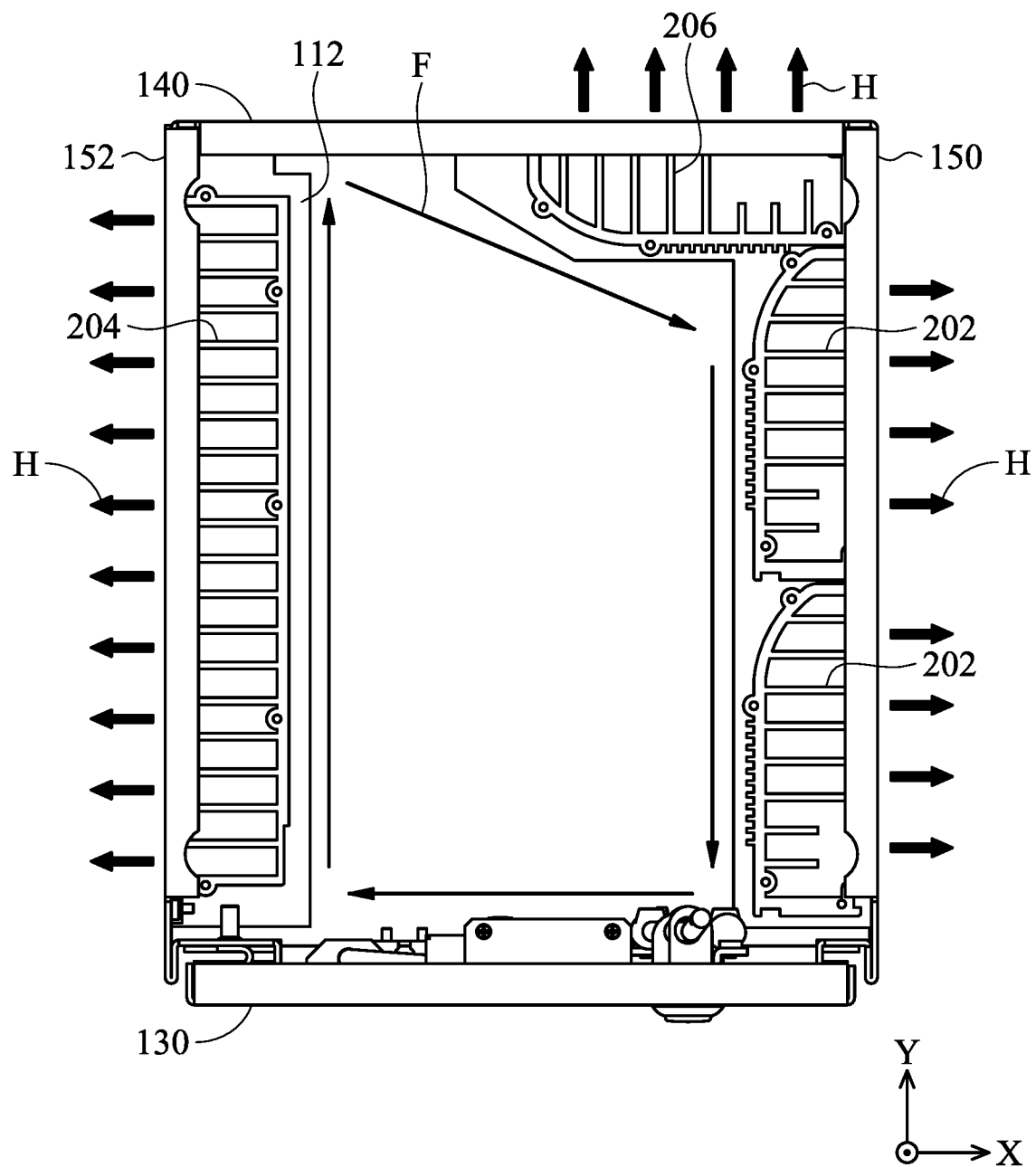
FIG. 6 is a top view of some elements in the cabinet of an embodiment of the present invention.

FIG. 6 is a top view of some elements in the cabinet 10 of an embodiment of the present invention. FIG. 6 mainly shows the relative positions of the frame 112, the door 130, the back plate 140, and the side plates 150 and 152 and the fin elements 202, 204 and 206. The heat dissipation mechanism of the cabinet 10 is illustrated in FIG. 6.

Figure 7:
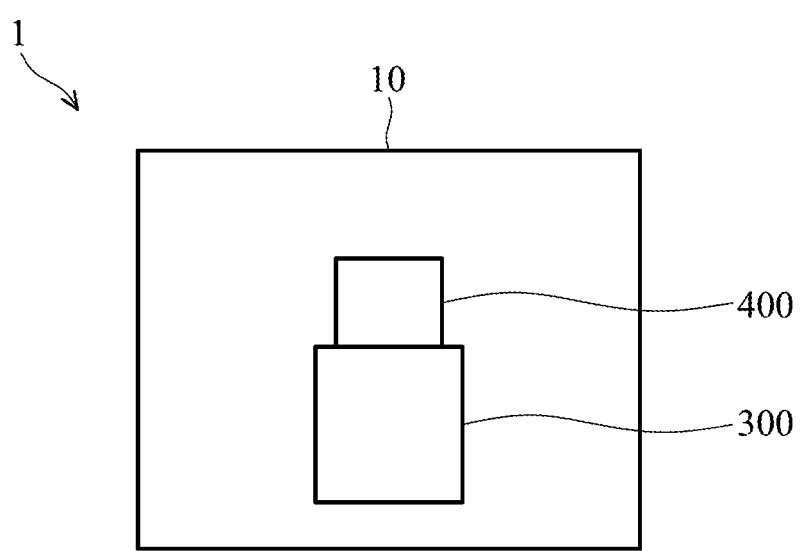
FIG. 7 is a cross-sectional view of a cabinet including a power converter and a fin of an embodiment of the present invention.

In fact, the devices disposed in the cabinet 10 usually have fans to move the heat generated by devices away from those devices. For example, as shown in FIG. 7, a power converter 300 may be disposed in the cabinet 10, and a fan 400 may be disposed on the power converter 300. As a result, the fan 400 of the power converter 300 may further facilitate heat convection in the cabinet 10, and the heat may be dissipated further out from the cabinet 10 by the fin elements 202, 204 and 206. The cabinet 10, the power converter 300 and the fan 400 form an electronic device 1.

For example, in FIG. 6, the air in the cabinet 10 may flow in the directions indicated by the arrows F in the cabinet 10 to increase the heat dissipation rate of the cabinet 10 (e.g. the heat may be dissipated in the direction indicated by the arrows H in FIG. 6). Furthermore, the waterproof pads 114 and 116 may seal the space where air flows as a closed space, so the cabinet 10 can be a mechanism for close-looped circulating heat dissipation. The function of heat exchange with the fin elements 202, 204 and 206 is achieved by continuously circulating the air in the cabinet 10. As a result, the cabinet 10 of the present invention has a better heat exchanging function than a conventional unsealed cabinet, even if there is a fan disposed in the conventional unsealed cabinet, because the cabinet 10 is sealed.

As a result, no additional active heat dissipation elements (e.g. fan, heat exchanger, air conditioner and thermoelectric air conditioner, etc.) should be disposed in the cabinet 10. The function of heat dissipation may be achieved by the fin elements and the fan of the device disposed in the cabinet 10, so energy consumption may be reduced, and additional space may be provided to other devices disposed in the cabinet 10.

In summary, a cabinet having passive heat dissipation function is provided in the embodiments of the present invention. This cabinet is not only waterproof and dustproof, but it is also able to dissipate heat generated in the cabinet to the outside without consuming additional energy, so the devices disposed in the cabinet may be protected from damage caused by external environmental factors. Furthermore, the heat generated in the cabinet may be dissipated faster, to increase the reliability and efficiency of the device disposed in the cabinet.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, and composition of matter, means, methods and steps described in the specification. As one of ordinary skill in the art will readily appreciate from the invention of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An electronic device, comprising:
   a cabinet, comprising
      a case having at least one opening; and
      a fin element, disposed in the case and adjacent to the at least one opening, comprising a main body and a plurality of fins, wherein the fins are disposed on the main body and face the at least one opening;
   a power converter disposed in the cabinet;
   a fan disposed in the cabinet, wherein the fan is disposed on the power converter, and the fin element does not pass through the opening of the case;
   a pipe passing through the case; and
   a waterproof element disposed between the pipe and the case to seal a gap between the pipe and the case.

2. The electronic device as claimed in claim 1, further comprising a sealing assembly disposed in the case, wherein the sealing assembly, the case and the fin elements form a space.

3. The electronic device as claimed in claim 2, wherein the sealing assembly comprises a frame and a waterproof pad, wherein the waterproof pad is disposed between the frame and the fin element.

4. The electronic device as claimed in claim 1, wherein the plurality of fins of the fin element comprises:
   a plurality of first fins disposed on one side of the main body; and
   a plurality of second fins disposed on the other side of the main body opposite the side with the first fins.

5. The electronic device as claimed in claim 4, wherein the first fins are longer than the second fins.

6. The electronic device as claimed in claim 5, wherein the first fins face the at least one opening of the case.

7. The electronic device as claimed in claim 4, wherein the amount of the first fins is less than the amount of the second fins in a given area.

8. The electronic device as claimed in claim 7, wherein the first fins face the at least one opening of the case.

9. The electronic device as claimed in claim 1, wherein the case comprises a door, a plurality of side plates, a top plate and a bottom plate, the top plate is opposite from the bottom plate, and the door and the side plates are disposed between the top plate and the bottom plate, wherein the fin element faces one of the side plates.

10. The electronic device as claimed in claim 9, wherein the bottom plate comprises a first hole corresponding to the fin element, and the first hole is aligned with the fin element along a direction that is perpendicular to the bottom plate.

* * * * *